（12） United States Patent
Settles

(10) Patent No.: US 6,461,155 B1
(45) Date of Patent: Oct. 8, 2002

(54) METHOD AND APPARATUS FOR HEATING SUBSTRATES IN SUPERCRITICAL FLUID REACTOR

(75) Inventor: E. Derryck Settles, Franklin, MA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/919,399

(22) Filed: Jul. 31, 2001

(51) Int. Cl.[7] ................................................. F27D 5/00
(52) U.S. Cl. ..................... 432/247; 432/253; 392/416; 392/418; 118/728; 118/725
(58) Field of Search ................. 432/247, 253; 392/416, 418; 118/725, 728, 724, 733; 219/209

(56) References Cited

U.S. PATENT DOCUMENTS

| | | | |
|---|---|---|---|
| 5,695,566 A | * 12/1997 | Suzuki et al. | 118/728 |
| 5,735,339 A | * 4/1998 | Davenport et al. | 277/236 |
| 5,804,089 A | * 9/1998 | Suzuki et al. | 118/728 |
| 5,922,133 A | * 7/1999 | Tepman et al. | 118/728 |
| 5,950,723 A | * 9/1999 | Heimanson et al. | 118/725 |
| 6,075,701 A | * 6/2000 | Ali et al. | 361/704 |

* cited by examiner

Primary Examiner—Gregory Wilson
(74) Attorney, Agent, or Firm—DeLio & Peterson, LLC; Anthony P. DeLio; Roland Tso

(57) ABSTRACT

A heater for heating a substrate in a supercritical fluid reactor includes a heater body having a heater chamber initially open to the interior of the reactor. The heater chamber is sized to match the substrate and includes a seal around its perimeter that seals against the perimeter of the substrate and forms a closed heater chamber with the backside of the substrate. A heating element, insulated from the heater body, preferably with pyrolytic graphite, is located in the heater chamber to heat the substrate from the backside. A clamp ring with a seal around its inner perimeter cooperates with the heater body to seal the substrate to the heater body. The heater is preferably spaced apart from the substrate, as well as the walls of the eater chamber and the insulator, to provide uniform heating by transferring heat through the supercritical fluid. The invention is also directed to the method of heating the substrate in which the supercritical fluid reactor is pressurized before the heater chamber is sealed or isolated to maintain uniform pressure on the substrate.

21 Claims, 1 Drawing Sheet

METHOD AND APPARATUS FOR HEATING SUBSTRATES IN SUPERCRITICAL FLUID REACTOR

BACKGROUND OF THE INVENTION

1. Field of the Invention

This invention relates to supercritical fluid (SCF) process reactors used in the deposition of metal and dielectric thin films on substrates, such as semiconductor substrates. More specifically, the present invention relates to heaters used in SCF process reactors to heat the substrate during processing.

2. Description of Related Art

Many cleaning and deposition processes, including chemical vapor deposition (CVD), physical vapor deposition (PVD) and supercritical fluid-based processes require heating the substrate to initiate the desired deposit. In conventional low-pressure CVD and PVD processes the substrate is often heated by placing it in direct contact with a relatively thin resistively heated metallic or ceramic plate forming part of the reactor wall. The substrate is heated with a resistive heater placed on the backside of the thin plate. While this design is effective in the low-pressure environment of conventional CVD and PVD reactors, it has a number of shortcomings in the high-pressure environment of SCF processes.

To safely contain the high-pressure (200 to 300 atmospheres) supercritical fluid used in SCF processes, the walls of an SCF reactor are substantially thicker than those used in a CVD or PVD reactor. A wall thickness of greater than 4 inches (10 cm) is commonly used. Using a conventional CVD or PVD reactor heater design in an SCF reactor would require heating the substrate through a very thick wall that must be capable of withstanding the high-pressure sustained by the SCF reactor walls; not the relatively low-pressure encountered in a CVD or PVD reactor.

Because the walls of an SCF reactor are normally constructed of a relatively low thermal conductivity material, such as stainless steel or a nickel-molybdenumchromium alloy, a resistive-element heater attached to the backside of a thick wall of such material would have a thermal latency of at least many tens of minutes, making wafer temperature control very difficult and inefficient.

A related problem is that the thick wall would act as a large heat reservoir and would transfer heat to the SCF reactor walls, nearby components and the supercritical fluid. Such wall heating could result in unwanted deposition on the walls or chemical reaction in the supercritical fluid. Also, the power that would be required to heat such a massive plate would be much greater than is required with conventional thin-wall CVD or PVD heater designs.

In a typical CVD or PVD process chamber the chamber walls are effectively thermally isolated from the substrate and from the heater by the low process pressure (near vacuum) in the chamber. However, in an SCF reactor the supercritical fluid has a very high thermal conductivity compared to that of the CVD or PVD vacuum environment. Heat is rapidly transferred through the supercritical fluid medium to all reactor walls and surfaces. Unless this transfer of heat is controlled, deposition will occur on unwanted surfaces and power requirements for the heater will be greatly increased.

Bearing in mind the problems and deficiencies of the prior art, it is therefore an object of the present invention to provide a method and apparatus for heating a substrate in a supercritical fluid reactor which avoids the necessity to heat a large wall mass and prevents excess heat loss to the wall and/or SCF which would increase power requirements and result in undesired deposition on the wall or internal components.

It is another object of the present invention to provide a method and apparatus for heating a substrate in a supercritical fluid reactor that has improved temperature control and fast response as compared to existing heater designs.

A further object of the invention is to provide a method and apparatus for heating a substrate in a supercritical fluid reactor that uses the supercritical fluid to maximize heat transfer to the substrate.

It is yet another object of the present invention to provide a method and apparatus for heating a substrate in a supercritical fluid reactor that does not require the heater to be a structural component of the SCF reactor wall.

Still another object of the present invention is to provide a method and apparatus for heating a substrate in a supercritical fluid reactor in which all heater components are in an isobaric environment.

Yet another object of the present invention is to provide a method and apparatus for heating a substrate in a supercritical fluid reactor in which the edges and backside of the substrate are protected from undesired deposition.

Still other objects and advantages of the invention will in part be obvious and will in part be apparent from the specification.

SUMMARY OF THE INVENTION

The above and other objects, which will be apparent to those skilled in the art, are achieved in the present invention, which is directed to a heater for heating a substrate in a supercritical fluid reactor. The heater includes a clamp, a heater body having a heater chamber, a heating element in the heater chamber and an insulator in the heater chamber insulating the heating element from the walls of the heater chamber. The clamp and the heater body are relatively movable to clamp the substrate between them and form an isolated heater chamber.

When the substrate is disk-shaped it is preferred for the clamp to be a clamp ring and clamp the perimeter of the substrate against the perimeter of the heater chamber. The clamp ring includes a clamp ring seal that cooperates with a heater body seal and seals against the outer edge of the substrate.

In the preferred design, the heater body is integral to the wall of the supercritical fluid reactor. In the most highly preferred embodiment of the invention, the heating element is spaced apart from the insulator, from the back of the substrate and from the walls of the heater chamber and supercritical fluid is used to transfer heat from the heating element to the back of the substrate.

The heater is designed to maintain an equal pressure on both sides of the substrate.

The insulator may be constructed of pyrolytic graphite which has excellent properties for preventing heat from escaping the heater chamber while ensuring uniform heating of the substrate.

The invention is also directed to a method of heating a substrate in a supercritical fluid reactor including the steps of:

providing a heater chamber open to an interior of the supercritical fluid reactor, the heater chamber including a heating element insulated from a wall of the supercritical fluid reactor;

positioning the substrate between the heater chamber and the interior of the supercritical fluid reactor filling the supercritical fluid reactor and the heater chamber with supercritical fluid;

sealing a perimeter of the substrate to a perimeter of the heater chamber to seal supercritical fluid in the heater chamber; and heating the substrate with the heating element.

In another aspect of the invention the method includes the steps of:

providing a heater for heating the substrate, the heater including:
a heater body defining a heater chamber,
a clamp adapted to clamp a perimeter of the substrate to a perimeter of the heater chamber,
a heating element having a front side and a backside, the heating element being mounted within the heater chamber, and
an insulator mounted within the heater chamber to insulate the heating element from the heater body;

positioning the substrate between the clamp and the heater body; filling the supercritical fluid reactor and the heater chamber with supercritical fluid;

pressurizing the supercritical fluid in the supercritical fluid reactor and the heater chamber to a desired pressure;

clamping the substrate between the clamp and the heater body after the supercritical reactor is pressurized to form a sealed heater chamber containing supercritical fluid at substantially the same desired pressure as the pressure of the supercritical fluid in the supercritical fluid reactor; and heating the substrate with the heating element.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS(S)

Figure 1:
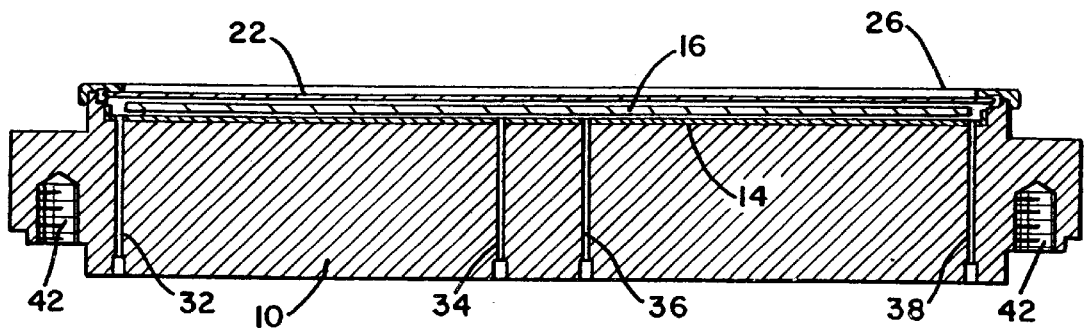
FIG. 1 is a cross sectional view through a heater for a supercritical fluid reactor in accordance with the present invention. The heater is shown in the closed position with a wafer substrate held in the heater.
Figure 2:
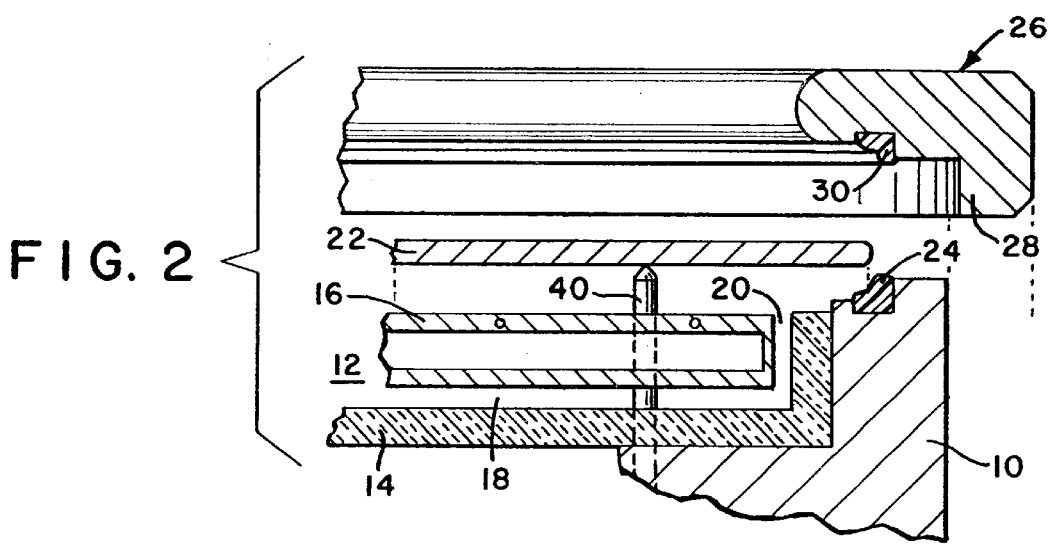
FIG. 2 is a detailed cross sectional view showing the upper right corner of the heater for a supercritical fluid reactor of FIG. 1. The heater is shown in the open position with a wafer substrate inserted into the heater. The heater is ready to be closed.
Figure 3:
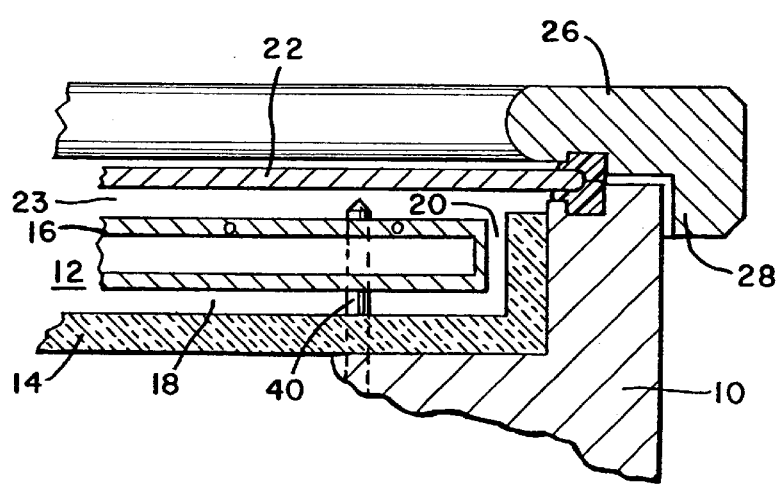
FIG. 3 is a detailed cross sectional view showing the upper right corner of the heater for a supercritical fluid reactor of FIG. 1. The heater is shown in the closed position with a wafer substrate being heated by the heater.

Referring to FIGS. 1–3, in which like numerals refer to like features of the invention, the present invention includes an approximately cylindrical heater body 10 having a recessed upper surface defining a heater chamber 12. The heater body 10 is fitted into a corresponding circular opening in an SCF reactor and has sufficient strength to act as a wall of the SCF reactor during processing. Thus, the heater body 10 is capable of withstanding several hundred atmospheres of pressure.

The heater chamber 12 is preferably a shallow, substantially cylindrical chamber that is lined with an insulator 14. The insulator 14 is preferably pyrolytic graphite. Pyrolytic graphite is an anisotropic material that conducts heat well in one direction and poorly in the transverse direction. It is installed or oriented into the heater chamber 12 so that it conducts heat well in the direction parallel to the inner surfaces of the heater chamber and poorly in the perpendicular direction. This confines the heat within the heater chamber minimizing losses to the surrounding reactor walls, and helps ensure that the heating within the chamber is uniform.

Mounted inside the insulated heater chamber is a heating element 16 such as a Boralectric® heating element. As can be seen in FIGS. 2 and 3, the heating element 16 is preferably spaced apart from the facing surfaces of the insulator 14 by space 18 beneath the heating element and by space 20 around the edges. Substrate 22 is positioned above the heating element 16, separated from it by space 23. Space 18 defines a backside volume and space 23 defines a front side volume when the substrate is clamped between the clamp and the heater body. The backside volume and front side volume are interconnected with space 20 and receive supercritical fluid during operation of the supercritical fluid reactor.

During operation of the SCF reactor, the spaces 18, 20 and 23 allow supercritical fluid to circulate around the heating element. Many SCF fluids have excellent heat transfer properties and the fluid around the heating element ensures that heating of the wafer is uniform. The anisotropic heat conduction and insulation properties of insulator 14 prevent excess heat from being conducted to the heater body 10 and adjacent walls of the SCF reactor.

The heater chamber 12 has a slightly smaller diameter than the substrate 22 positioned above it. The substrate 22 extends slightly beyond the edge of the heater chamber so that the perimeter of the substrate can seal against a heater body seal 24. The heater body seal is fitted into a ring groove machined into the perimeter of the heater body 10. The heater body seal contacts the back and edges of the substrate 22, at its outer perimeter, when the heater chamber is sealed by the substrate 22. The closed and sealed position is shown in FIGS. 1 and 3 and the open, unsealed, position is shown in FIG. 2.

The seal between the substrate and the heater body is also accomplished with a clamp in the form of clamp ring 26. Clamp ring 26 includes a lip 28 that overlaps the outer circular edge of the heater body 10. The clamp ring 26 is open in the center to expose almost the entire upper surface of the substrate 22 for processing by the SCF reactor. The backside of the substrate 22 is almost entirely exposed to the interior of the heater chamber and is directly above the heating element.

A clamp ring seal 30, corresponding to the heater body seal 24, is positioned in a second ring groove located on the underside of the clamp ring 26. The clamp ring seal contacts the upper surface and the edge of the substrate 22 at its perimeter when the clamp ring clamps the substrate 22 to the heater chamber as shown in FIG. 3. The upper clamp ring seal and the lower heater body seal cooperate with the substrate to seal the heater chamber during SCF processing and prevent unwanted edge and backside deposition.

The heater body 10 is designed to form a portion of the wall of the SCF reactor and accordingly is constructed of a thick wall material such as stainless steel (preferably 316L SST) or a nickel molybdenum chromium alloy (such as Hastelloy® C276). Passages 32, 34, 36 and 38 penetrate this wall and allow supercritical fluid to be supplied to the heater chamber at the same pressure as supercritical fluid in the interior of the reactor. Passages 32, 34, 36 and 38 may be connected directly to the interior of the SCF reactor or to SCF supply sources pressurizing the interior of the reactor so that the pressure in the heater chamber is always the same as the pressure in the reactor chamber. This prevents a pressure differential from being applied across the substrate 22 which would crack or damage it.

Variations on the number, location and connection of the passages to maintain the required isobaric environment around the substrate are possible and are contemplated within this invention. It is preferred that the design of the heater allow pure supercritical fluid, without deposition additives to be supplied to the heater chamber to prevent undesired deposition on the back side of the substrate or in the heater chamber.

To move the substrate into and out of the heater chamber requires two distinct motions, one parallel to the plane of the substrate to move it in and out of the position seen in FIG. 2, and one perpendicular to the plane of the substrate to move it from the position seen in FIG. 2 to the position seen in FIG. 3. The first motion (parallel to the plane of the substrate) is achieved with a conventional substrate handler (not shown), which uses a thin substrate handling arm. The substrate handling arm inserts the substrate between the clamp ring and the heater body and sets it down on lift pins 40.

The second motion (perpendicular to the plane of the substrate) is achieved with lift pins 40 (see FIGS. 2 and 3) that can be driven perpendicular to the substrate to raise and lower it. The lift pins are entirely conventional and are magnetically coupled in the known way through the heater body 10 to avoid the necessity for seals capable of withstanding the high internal pressures of an SCF reactor. The lift pins (at least three are needed to provide multipoint support) penetrate the insulator 14 and the heating element 16 and support the substrate 22 on their tips, allowing the substrate to be raised to the position seen in FIG. 2 (where the substrate can be released by the handler and the handler retracted from the chamber) and lowered to the position seen in FIGS. 1 and 3 (for processing).

In use, the heater body is bolted into the SCF reactor with bolts engaging threaded openings 42 and an internal clamp actuator (not shown) lifts the clamp ring relative to the heater body to the position shown in FIG. 2. A conventional substrate handler then brings the substrate 22 into the position seen in FIG. 2 between the raised clamp ring 26 and the heater body 10. The substrate handler sets the substrate 22 onto lift pins 40 which are in the extended position seen in FIG. 2. The handler sets the wafer on the pins and then retracts from the reactor. A reactor isolation valve closes and the reaction is made ready for the injection of gases or supercritical fluids. The SCF reactor is then pressurized with the supercritical fluid (such as $SCCO_2$) while the heater chamber is in the open position seen in FIG. 2. The supercritical fluid flows into the reactor interior and into the heater chamber on both sides of the substrate 22 and on both sides and around the perimeter of heating element 16.

Once the desired pressure has been reached, the lift pins 40 are retracted to lower the substrate 22 onto the heater body seal 24. The clamp ring 26 is then lowered to bring the clamp ring seal 30 into contact with the perimeter of the substrate 22 and form the desired seal. This seal protects the edge of the substrate from deposition and prevents supercritical fluid in front of the substrate from carrying deposition additives into supercritical fluid in the heater chamber.

After the heater chamber is sealed (as shown in FIG. 3) the heating element 16 is turned on and the backside of the substrate 22 is heated. The presence of supercritical fluid in spaces 18 and 20 and between the heating element 16 and the substrate 22 ensures that the substrate will be heated uniformly. The insulator 14 prevents heat from being transferred to the heater body 10 or to adjacent walls of the reactor, which would result in undesirable deposition and increase the heating element power requirements. The front surface of the heated substrate is exposed directly to supercritical fluid in the main reactor chamber to which deposition additives are injected at appropriate pressure and deposition occurs almost exclusively on the front surface of the substrate.

Once processing has been completed, the clamp ring 26 is raised, the lift pins 40 are extended and the substrate is brought to the position seen in FIG. 2 so it may be removed by the substrate handler. Although is it preferred for the heating element 16 to be separated from the substrate and insulator, the invention is also operable without the spaces around the heater, which use supercritical fluid for heat transfer, provided that uniform pressure is maintained on both sides of the substrate 22.

It is also possible for other types of clamps to be employed or for the heating element, substrate and heating chamber to be moved relative to a fixed clamp ring or for the substrate to be fixed and for the clamp and heater both to be movable, instead of using a fixed heater body as in the preferred embodiment.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A heater for heating a substrate in a supercritical fluid reactor, the heater comprising:
   a clamp;
   a heater body adapted for mounting in the supercritical fluid reactor, the clamp and heater body being relatively movable and cooperating to clamp the substrate therebetween, the heater body defining a heater chamber between a backside of the substrate and the heater body;
   a heating element having a front side and a backside, the heating element being mounted within the heater chamber with the front side facing the backside of the substrate; and
   an insulator mounted within the heater chamber between the backside of the heating element and the heater body.

2. The heater for heating a substrate in a supercritical fluid reactor according to claim 1 wherein the clamp comprises a clamp ring clamping a perimeter of the substrate against a perimeter of the heater chamber.

3. The heater for heating a substrate in a supercritical fluid reactor according to claim 2 wherein the clamp ring includes a clamp ring seal for sealing against the perimeter of the substrate.

4. The heater for heating a substrate in a supercritical fluid reactor according to claim 1 wherein the heater body includes a heater body seal for sealing against a perimeter of the substrate.

5. The heater for heating a substrate in a supercritical fluid reactor according to claim 1 wherein the clamp comprises a clamp ring including a clamp ring seal for sealing against an upper part of a perimeter of the substrate and the heater body includes a heater body seal for sealing against a lower part of the perimeter of the substrate.

6. The heater for heating a substrate in a supercritical fluid reactor according to claim 1 wherein the heater body has sufficient strength to form a wall of the supercritical fluid reactor.

7. The heater for heating a substrate in a supercritical fluid reactor according to claim 1 wherein the backside of the heating element is spaced apart from the insulator.

8. The heater for heating a substrate in a supercritical fluid reactor according to claim 1 wherein the front side of the heating element is spaced apart from the substrate when the substrate is clamped between the clamp and the heater body.

9. The heater for heating a substrate in a supercritical fluid reactor according to claim 1 wherein the backside of the heating element is spaced apart from the insulator, thereby defining a backside volume and the front side of the heating element is spaced apart from the substrate thereby defining a front side volume when the substrate is clamped between the clamp and the heater body, the backside volume and front side volume being interconnected and connected to receive supercritical fluid during operation of the supercritical fluid reactor.

10. The heater for heating a substrate in a supercritical fluid reactor according to claim 9 wherein the heater body includes at least one passage for supplying supercritical fluid to the heater chamber.

11. The heater for heating a substrate in a supercritical fluid reactor according to claim 1 wherein the insulator comprises pyrolytic graphite.

12. The heater for heating a substrate in a supercritical fluid reactor according to claim 1 wherein the heating element is spaced apart from walls of the heater chamber to allow supercritical fluid to substantially surround the heating element.

13. The heater for heating a substrate in a supercritical fluid reactor according to claim 1 further including at least one seal, the seal contacting an edge of the substrate to prevent deposition on the edge of the substrate.

14. A method of heating a substrate in a supercritical fluid reactor comprising the steps of:
providing a heater chamber open to an interior of the supercritical fluid reactor, the heater chamber including a heating element insulated from a wall of the supercritical fluid reactor;
positioning the substrate between the heater chamber and the interior of the supercritical fluid reactor;
filling the supercritical fluid reactor and the heater chamber with supercritical fluid;
sealing a perimeter of the substrate to a perimeter of the heater chamber to seal supercritical fluid in the heater chamber; and
heating the substrate with the heating element.

15. The method of heating a substrate in a supercritical fluid reactor according to claim 14 wherein the step of positioning the substrate includes moving the substrate between a clamp and the heater chamber and the step of sealing comprises clamping the perimeter of the substrate to the perimeter of the heater chamber with the clamp.

16. The method of heating a substrate in a supercritical fluid reactor according to claim 15 wherein the clamp comprises a clamp ring.

17. The method of heating a substrate in a supercritical fluid reactor according to claim 14 wherein the step of positioning the substrate includes the steps of moving the substrate parallel to the heating element, followed by moving the substrate perpendicular to the heating element to bring the perimeter of the substrate into contact with the perimeter of the heater chamber.

18. The method of heating a substrate in a supercritical fluid reactor according to claim 17 wherein the step of sealing the perimeter of the substrate to the perimeter of the heater chamber comprises moving a clamp ring perpendicular to the heating element and into sealing contact with the perimeter of the substrate and the perimeter of the heater chamber.

19. The method of heating a substrate in a supercritical fluid reactor according to claim 14 wherein the step of providing a heater chamber including a heating element comprises providing a heater chamber having a heating element spaced apart from walls of the heater chamber to allow supercritical fluid to substantially surround the heating element.

20. A method of heating a substrate in a supercritical fluid reactor comprising the steps of:
providing a heater for heating the substrate, the heater including:
a heater body defining a heater chamber,
a clamp adapted to clamp a perimeter of the substrate to a perimeter of the heater chamber,
a heating element having a front side and a backside, the heating element being mounted within the heater chamber, and
an insulator mounted within the heater chamber to insulate the heating element from the heater body;
positioning the substrate between the clamp and the heater body;
filling the supercritical fluid reactor and the heater chamber with supercritical fluid;
pressurizing the supercritical fluid in the supercritical fluid reactor and the heater chamber to a desired pressure;
clamping the substrate between the clamp and the heater body after the supercritical reactor is pressurized to form a sealed heater chamber containing supercritical fluid at substantially the same desired pressure as the pressure of the supercritical fluid in the supercritical fluid reactor; and
heating the substrate with the heating element.

21. The method of heating a substrate in a supercritical fluid reactor according to claim 20 wherein the step of providing a heater comprises providing a heater including an insulator of pyrolytic graphite.

* * * * *

UNITED STATES PATENT AND TRADEMARK OFFICE
CERTIFICATE OF CORRECTION

PATENT NO. : 6,461,155 B1
DATED : October 8, 2002
INVENTOR(S) : E. Derryck Settles It is certified that error appears in the above-identified patent and that said Letters Patent is hereby corrected as shown below:

<u>Title page,</u>
Item [57], ABSTRACT,
Line 13, after "of the" delete "eater" and substitute therefor -- heater --.

Signed and Sealed this

Eighteenth Day of March, 2003

JAMES E. ROGAN
*Director of the United States Patent and Trademark Office*